United States Patent
Chung

(10) Patent No.: US 7,355,287 B2
(45) Date of Patent: Apr. 8, 2008

(54) SEMICONDUCTOR CHIP PACKAGE AND METHOD FOR FABRICATING THE SAME

(75) Inventor: Qwan Ho Chung, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 535 days.

(21) Appl. No.: 10/891,377

(22) Filed: Jul. 14, 2004

(65) Prior Publication Data

US 2005/0253279 A1    Nov. 17, 2005

(30) Foreign Application Priority Data

Apr. 29, 2004    (KR) .......................... 2004-30236

(51) Int. Cl.
*H01L 23/48* (2006.01)
(52) U.S. Cl. .................................. 257/780; 257/529
(58) Field of Classification Search ................ 257/780, 257/529
See application file for complete search history.

(56) References Cited

U.S. PATENT DOCUMENTS

| | | | |
|---|---|---|---|
| 6,002,169 A * | 12/1999 | Chia et al. | 257/697 |
| 6,655,022 B1 * | 12/2003 | Eskildsen et al. | 29/841 |
| 6,847,105 B2 * | 1/2005 | Koopmans | 257/686 |
| 6,917,119 B2 * | 7/2005 | Lee et al. | 257/780 |

* cited by examiner

*Primary Examiner*—Roy Potter
(74) *Attorney, Agent, or Firm*—Ladas & Parry LLP

(57) ABSTRACT

Disclosed are a semiconductor chip package and a method for fabricating the same. The semiconductor chip package includes a semiconductor chip and a circuit board. The semiconductor chip is bonded to the circuit board by means of adhesive except for a metal-exposed region of the semiconductor chip. Anti-migration material is formed between the circuit board and a predetermined portion of the semiconductor chip, in which the predetermined portion of the semiconductor chip has no adhesive, in order to prevent material contained in the metal trace from migrating to the metal-exposed region of the semiconductor chip. A lamination phenomenon is not created between the circuit board and the semiconductor chip after the HAST has been carried out.

6 Claims, 2 Drawing Sheets

SEMICONDUCTOR CHIP PACKAGE AND METHOD FOR FABRICATING THE SAME

BACKGROUND OF THE INVENTION

1. Field of the Invention

The present invention relates to a semiconductor chip package and a method for fabricating the same, and more particularly to an FBGA (fine pitch ball grid array) type semiconductor chip package and a method for fabricating the same.

2. Description of the Prior Art

Recently, as information media, such as computers have been widely used, the semiconductor industry makes great strides. In a functional aspect, a semiconductor device must be operated at a high speed with a large storage capacity. To this end, the semiconductor technology has been developed to improve the integration degree, reliability and response speed of the semiconductor device.

Particularly, the semiconductor chip package has been developed from a pin-insertion type semiconductor chip package to a surface-mounting type semiconductor chip package in order to increase packaging density. Currently, an FBGA (fine pitch ball grid array) type semiconductor chip package has been developed in order to increase packaging density. Such an FBGA type semiconductor chip package has a stacked structure so that the packaging density thereof will be further increased.

One example of such FBGA type semiconductor chip packages is disclosed in U.S. Pat. No. 6,127,194, issued to Mahanpour, et al.

Referring to FIG. 1, an FBGA type semiconductor chip package includes a circuit board 10 and a semiconductor chip 12. The circuit board 10 is formed with a core 110, a copper trace 112, and a solder mask 114. In addition, the semiconductor chip 12 has protective layers 120a and 120b, which are sequentially aligned at an uppermost part of the semiconductor chip 12, and a fuse 122, which is formed by exposing metal. In addition, a solder ball 16 is formed on the circuit board 10 such that the circuit board 10 is connected to external devices. Herein, the circuit board 10 is bonded to the semiconductor chip 12 by means of adhesive 14, such as a tape.

In addition, after bonding the circuit board 10 to the semiconductor chip 12, an HAST (highly accelerated stress test) is carried out for testing reliability of the semiconductor device. One example of the HAST is disclosed in U.S. Pat. No. 6,265,550, issued to Herr, et al.

However, when the HAST has been finished, it is frequently found that protective layers 120a and 120b of the semiconductor chip 12 are delaminated. Such a delamination phenomenon may be generated because material the copper trace 112 formed on the circuit board 10 migrates to a predetermined portion of the semiconductor chip 12 in which the fuse 122 is formed.

Therefore, as mentioned above, when the HAST is carried out for the conventional semiconductor chip package, a delamination phenomenon may frequently occur between the circuit board and the semiconductor chip. Thus, the conventional semiconductor chip package represents inferior reliability.

SUMMARY OF THE INVENTION

Accordingly, the present invention has been made to solve the above-mentioned problems occurring in the prior art, and a first object of the present invention is to provide a semiconductor chip package, in which a migration of copper trace material from a circuit board to a predetermined portion of a semiconductor chip, in which metal is exposed, is significantly reduced.

A second object of the present invention is to provide a semiconductor chip package capable of preventing material of a copper trace formed on a circuit board from migrating to a predetermined portion of a semiconductor chip in which metal is exposed.

In order to accomplish the first object, according to a first aspect of the present invention, there is provided a semiconductor chip package comprising a semiconductor chip and a circuit board. The circuit board is bonded to the semiconductor chip by means of adhesive except for a metal-exposed region of the semiconductor chip. An anti-migration section is formed between the circuit board and a predetermined portion of the semiconductor chip, in which the predetermined portion of the semiconductor chip has no adhesive means, in order to prevent material contained in the metal trace from migrating to the metal-exposed region of the semiconductor chip.

In order to accomplish the second object, according to a second aspect of the present invention, there is provided a method for fabricating a semiconductor chip package, the method comprising the steps of preparing a semiconductor chip and a circuit board. The semiconductor chip is bonded to the circuit board except for the metal-exposed region of the semiconductor chip. Anti-migration material is provided in the metal-exposed region of the semiconductor chip in such a manner that material contained in the metal trace is prevented from migrating to the metal-exposed region of the semiconductor chip.

According to the present invention, the anti-migration material, instead of adhesive material, is provided in the metal-exposed region of the semiconductor chip. As a result, material contained in the metal trace is prevented from migrating to the metal-exposed region of the semiconductor chip. Thus, semiconductor chip protective layers can be prevented from being laminated after an HAST, which is a reliability test, has been carried out.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
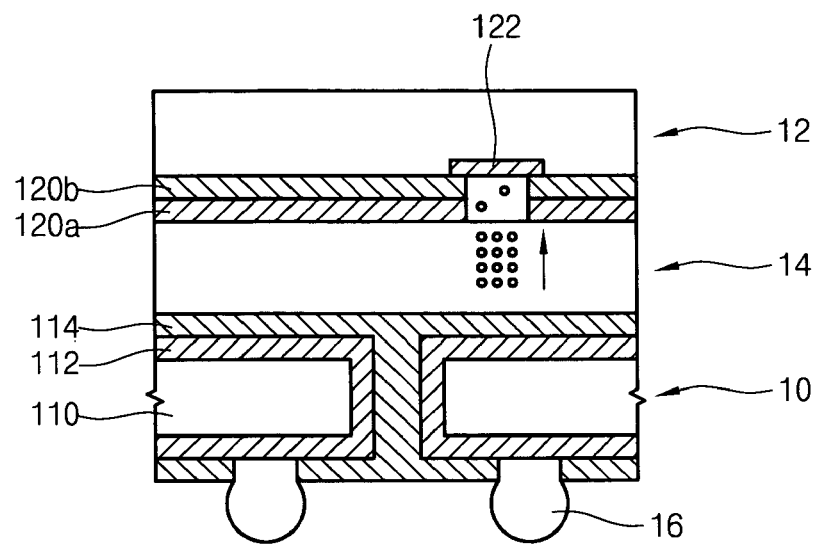
FIG. 1 is a schematic sectional view showing a conventional semiconductor package.

Hereinafter, the present invention will be described.

A semiconductor package chip of the present invention includes a circuit board and a semiconductor chip.

The circuit board has a core, a metal trace formed at both sides of the core and a solder mask formed on the metal trace. The metal trace preferably includes a copper trace. The copper trace is easily adapted for the circuit board. The solder mask has a pattern for exposing a part of the metal trace in such a manner that electrical connection parts, such as solder balls, can be connected to the metal trace.

The semiconductor chip has a metal-exposed region. The metal-exposed region includes a fuse region or a VSS region, in which cutting work for repair is carried out through an EDS (electric die sorting). Herein, the fuse region is formed in a peripheral area of the semiconductor chip and the VSS region is formed a scribe line, which is an edge region of the semiconductor chip.

In the above semiconductor chip package, the circuit board is bonded to the semiconductor chip by means of adhesive. The adhesive includes a tape or liquid-phase adhesive. If a thickness of adhesive is less than 30 µm, the thickness of adhesive may exert a bad influence to a subsequent molding process. In addition, if a thickness of adhesive is more than 300 µm, a thickness of the semiconductor chip may be enlarged. Thus, it is preferred that the thickness of adhesive is in a range of about 20 to 300 µm. In particular, bonding work using adhesive is not carried out with respect to the metal-exposed region of the semiconductor chip. That is, adhesive is not formed in the metal-exposed region of the semiconductor chip.

In the metal-exposed region of the semiconductor chip, an anti-migration section is formed in order to prevent material contained in the metal trace of the circuit board from migrating to the metal-exposed region. The anti-migration section includes epoxy molding compound. The epoxy molding compound is mainly used when molding the circuit board with the semiconductor chip. That is, when the circuit board is molded with the semiconductor chip, the metal-exposed region having no adhesive is also molded so that the anti-migration section is formed. In addition, it is also possible to from the anti-migration section in the metal-exposed region.

The semiconductor chip package includes solder balls aligned at a rear surface of the circuit board and connected to the metal trace of the circuit board.

According to the present invention, the circuit board is bonded to the semiconductor chip by using adhesive without forming adhesive in the metal-exposed region of the semiconductor chip. In addition, the anti-migration section is formed in the metal-exposed region having no adhesive in order to prevent material contained in the metal trace of the circuit board from migrating to the metal-exposed region.

Accordingly, the protective layers of the semiconductor chip cannot be laminated after the HAST has been carried out.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
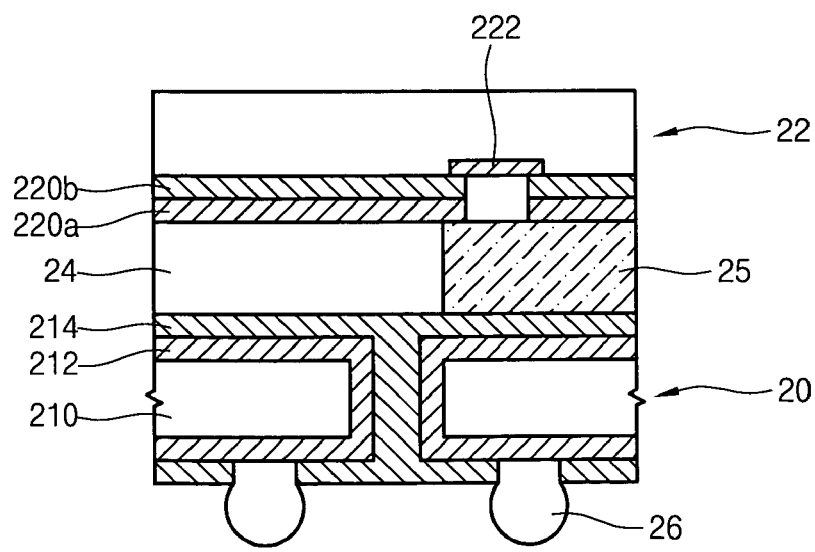
FIG. 2 is a sectional view showing a semiconductor chip package according to one embodiment of the present invention.

FIG. 2 is a sectional view showing a semiconductor chip package according to one embodiment of the present invention.

Referring to FIG. 2, the semiconductor chip package includes an FBGA type semiconductor chip package having a circuit board 20, a semiconductor chip 22, a tape 24, epoxy molding resin 25, and a solder ball 26.

The circuit board 20 includes a core 210, a copper trace 212 formed at both sides of the copper trace 212 and a solder mask 214 having a pattern for exposing a part of the copper trace 212. In addition, solder balls 26 are formed at a rear surface of the circuit board 20, in which the rear surface of the circuit board 20 is not bonded with the semiconductor chip 22. The solder balls 26 are connected to the copper trace 212 exposed through the solder mask 214. In addition, the semiconductor chip 22 has a fuse 222 and protective layers 220a and 220b, which are sequentially formed at an uppermost portion of the semiconductor chip 22. The semiconductor chip 22 is formed with a wiring structure, such as metal wirings.

The tape 24 is disposed between the circuit board 20 and the semiconductor chip 22 in order to bond the circuit board 20 to the semiconductor chip 22. The tape has a thickness of about 100 µm. In particular, the tape 24 is aligned between the circuit board 20 and a predetermined portion of the semiconductor chip 22 in which the fuse 222 is not formed. That is, the tape 24 is not formed in a fuse region of the semiconductor chip 22.

Instead of the tape 24, epoxy molding resin 25 is formed in the fuse region of the semiconductor chip 22. That is, the fuse region of the semiconductor chip 22 includes epoxy molding resin 25. By forming epoxy molding resin 25 instead of the tape 24, material contained in the copper trace 212 formed in the circuit board 20 is prevented from migrating to the fuse region of the semiconductor chip 22. In addition, it is also possible to further form epoxy molding resin 25 in the predetermined portion of the semiconductor chip 22, in which the fuse 222 is formed.

Figure 3A:
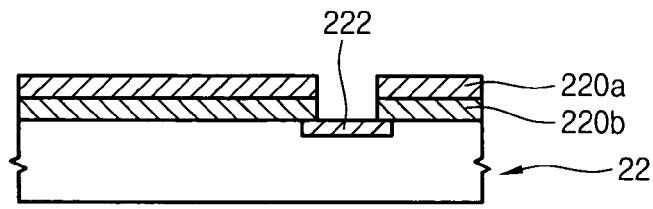
FIGS. 3a to 3c sectional views for explaining a method for fabricating a semiconductor chip package according to one embodiment of the present invention.
Figure 3B:
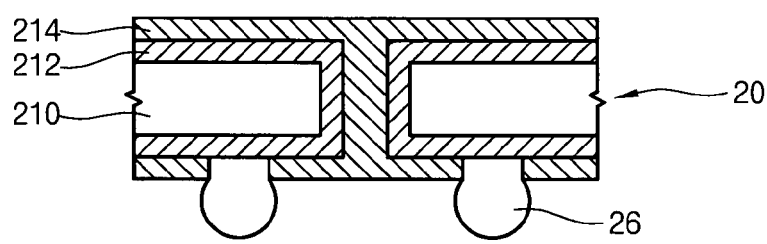
Figure 3C:
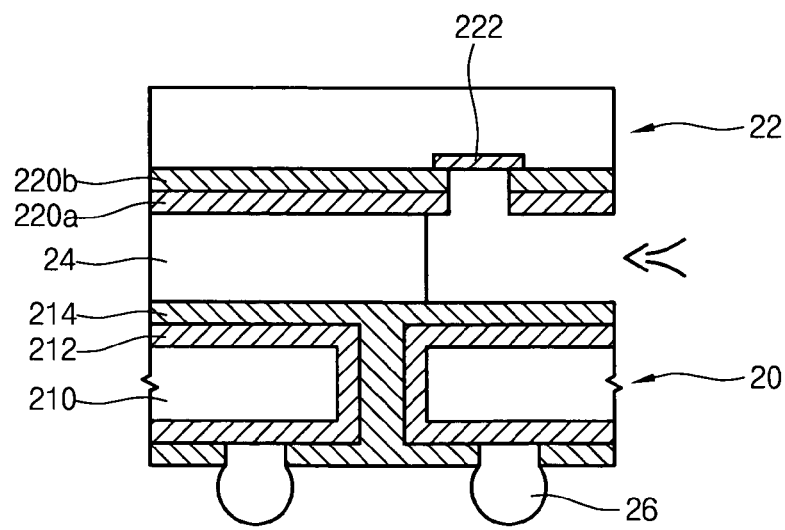

Hereinafter, a method for fabricating the semiconductor chip package having the tape 24 and epoxy molding resin 25 formed between the circuit board 20 and the semiconductor chip 22 will be described in detail with reference to FIGS. 3a to 3c.

Firstly, the semiconductor chip 22 having the fuse 222 is prepared. Then, the circuit board 20 having the copper trace 212 is prepared.

After that, the circuit board 20 is bonded to the semiconductor chip 22 by means of the tape 24 having a thickness of about 100 µm. At this time, the tape 24 is not applied to the whole area between the circuit board 20 and the semiconductor chip 22, but applied to a predetermined area between the circuit board 20 and the semiconductor chip 22 except for the fuse region. Thus, the tape 24 is formed between the circuit board 20 and the semiconductor chip 22 except for the fuse region so as to bond the circuit board 20 to the semiconductor chip 22.

Subsequently, a wire bonding process is carried out in order to electrically connect the circuit board 20 to the semiconductor chip 22. In addition, the circuit board 20 is molded with the semiconductor chip 22 by using epoxy molding resin 25. At this time, the circuit board 20 is molded with the semiconductor chip 22 even if the tape 24 is not formed therebetween. Epoxy molding resin 25 is formed between the circuit board 20 and the semiconductor chip 22 in which the tape 24 is not formed. That is, the epoxy molding resin 25 is formed between the circuit board 20 and the fuse region of the semiconductor chip 22.

After that, subsequent processes are sequentially carried out, thereby fabricating the semiconductor chip package.

As mentioned above, since epoxy molding resin 25 is formed between the circuit board 20 and the semiconductor chip 22, material contained in the copper trace 212 of the circuit board 20 is prevented from migrating to the fuse region of the semiconductor chip.

According to the present invention, the anti-migration section is formed in the fuse region of the semiconductor chip, so the semiconductor chip protective layers can be prevented from being laminated after the HAST has been carried out.

Thus, the present invention can achieve the semiconductor chip having improved reliability.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A semiconductor chip package comprising:
   a semiconductor chip having an exposed-metal fuse region;
   a circuit board including a core formed at both sides thereof with a metal trace and a solder mask formed on the metal trace, the solder mask having a pattern for exposing a predetermined part of the metal trace;
   an adhesive tape between the circuit board and the semiconductor chip except for areas of the semiconductor chip between the exposed-metal fuse region and the circuit board, said tape bonding the semiconductor chip to the circuit board; and
   a layer of epoxy formed between the circuit board and the exposed-metal fuse region and where there is no tape between the semiconductor chip and the circuit board, said epoxy acting to prevent conductive material contained in the metal trace of the circuit board from migrating to the exposed-metal-exposed fuse region of the semiconductor chip.

2. The semiconductor chip package as claimed in claim 1, wherein the metal-exposed region of the semiconductor chip includes a peripheral area and an edge area of the semiconductor chip.

3. The semiconductor chip package as claimed in claim 2, wherein the edge area is formed with a scribe line.

4. The semiconductor chip package as claimed in claim 1, wherein the metal trace of the circuit board includes a copper trace.

5. The semiconductor chip package as claimed in claim 1, wherein the tape has a thickness of about 30 to 300 μ.

6. The semiconductor chip package as claimed in claim 1, further comprising a solder ball provided at a rear surface of the circuit board and connected to the metal trace of the circuit board, in which the rear surface does not make contact with the semiconductor chip.

* * * * *